(12) United States Patent
Feng et al.

(10) Patent No.: US 8,314,432 B2
(45) Date of Patent: Nov. 20, 2012

(54) LIGHT EMITTING DEVICE WITH AN INSULATING LAYER

(75) Inventors: Hui Ching Feng, Taoyuan (TW);
Kuo-Chin Huang, Taoyuan (TW);
Shyi-Ming Pan, Taoyuan (TW);
Hung-Li Pan, Taoyuan (TW);
Yin-Cheng Chu, Taoyuan (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 416 days.

(21) Appl. No.: 12/349,055

(22) Filed: Jan. 6, 2009

(65) Prior Publication Data

US 2010/0032690 A1  Feb. 11, 2010

(30) Foreign Application Priority Data

Aug. 11, 2008  (TW) .............................. 97130598 A

(51) Int. Cl.
*H01L 29/18* (2006.01)
(52) U.S. Cl. .............................. 257/88; 257/89; 257/328
(58) Field of Classification Search .................... 277/88; 257/89, 328, 88
See application file for complete search history.

(56) References Cited

U.S. PATENT DOCUMENTS

| 6,547,249 B2 * | 4/2003 | Collins et al. .................... 257/88 |
| 7,378,288 B2 | 5/2008 | Tran et al. |
| 2005/0258437 A1 * | 11/2005 | Young .............................. 257/83 |

FOREIGN PATENT DOCUMENTS

| TW | 540169 | 7/2003 |
| TW | I221035 | 9/2004 |
| TW | I245103 | 12/2005 |
| TW | 200639907 | 11/2006 |

* cited by examiner

*Primary Examiner* — Jerome Jackson, Jr.
*Assistant Examiner* — Dale E Page
(74) *Attorney, Agent, or Firm* — Ming Chow; Sinorica, LLC

(57) ABSTRACT

The present invention is related to a light emitting device with an insulating layer, which comprises a transparent substrate, a first light emitting unit, a second light emitting unit, an insulating layer and a conducting layer. The first light emitting unit and the second light emitting unit are set up on the transparent substrate, wherein the second light emitting unit has an appearance of a stair structure. The insulating layer is set between the first and the second light emitting units. The conducting layer is on the insulating layer in order to conduct the first and the second light emitting units. Because of the appearance of the stair structure of the second light emitting unit, improving the cladding efficiency of the insulating layer, further improving the insulating efficiency of the insulating layer and avoiding the insulating layer loosing and the leakage between the first and the second light emitting units.

5 Claims, 3 Drawing Sheets

LIGHT EMITTING DEVICE WITH AN INSULATING LAYER

FIELD OF THE INVENTION

The present invention is related to a light emitting unit; particularly a light emitting device which has an insulating layer and a method for manufacturing thereof.

BACKGROUND OF THE INVENTION

Semiconductor processing technology is developing vigorously and going a step further in the nano stage which enhances the development of semiconductor, for example light emitting diodes and semiconductor laser etc. The photoelectronic semiconductors are widely applied to every photo electronic devices such as back light modules, electronic displays, traffic lights, overhand projectors and searchlights. Traditional photo electronic semiconductors are driven by direct current however most of the power supply for cities are using alternating current. The driving circuit for the photo electronics semiconductors has to add an external circuit, which converts the alternating current into the direct current. This means the cost is increased, the process of converting the alternating current to the direct current is affected by the power lost which reduces the operational efficiency of the photo electronics semiconductors thus it is important to develop the technology to apply the direct current for active the photo electronics semiconductors.

Now days the development of the photo electronics semiconductors which uses the AC power supply is distinguish. Many of the countries have disclosed related products or patents in this field, for example the U.S. Pat. No. 6,547,249 "Monolithic Series/Parallel LED Arrays Formed On highly Resistive Substrates" and the U.S. Pat. No. 6,957,89 "Light Emitting Diodes For High AC Voltage Operation and General Lighting" both have revealed that an alternating light emitting diodes modules includes at least two light emitting diode dies, dies of the light emitting diodes take turns to light by the positive and negative waveforms of the alternating currents according to their electrical conduction manners.

To ensure each of the light emitting diodes die is working, each of them has to be electrical independent with each other. In the old time the etching process is used to divide an indentation area between two of the LED dies and the dielectric material forms a dielectric layer on the top of the indentation area, for insulating the electrical conduction between each LED die. The metal coating on the top of dielectric layer is formed by evaporation or sputtering hence the covering of the metal coating is not efficient due to the edge of the metal coating bends too much or directly proportional, this causes the problem of the circuit being turned on or the increase of the resistance.

Taiwan patent number 200812100 "Alternating Current Light emitting device" has proposed a solution as shown in FIG. 1. FIG. 1 shows a prior art for a structure of the light emitting device with an insulate layer. The alternating LED apparatus 10 comprises a substrate 12, at least two dies 14, an insulator 16, a conductive structure 18, a indentation area 142 is formed between two die 14, two sides of two dies 14 is an inclined plane 144, the insulator 16 is formed in the indentation area 142 and attached to the inclined plane 144, conductive structure 18 is on the top of insulator 16 and electrical conducts to the die 14 wherein the die 14 is the LED die. The inclined plane 142 of the die 14 will cause the insulator 16 to loose and slide and the insulation is not efficient. Therefore, the inclined plane 144 of the light emitting device 10 cannot overcome the problem of the insulator 16 loosing and sliding and the insulation of the insulator 16 is not efficient, that will cause the leakage between light emitting units.

Hence, the present invention provides a light emitting device with an insulating layer that the outward appearance of the light emitting unit has a stair structure in order to avoid the insulating layer to slide and loose when it is set up on the light emitting unit thus to avoid the leakage between light emitting units.

SUMMARY

An objective of the present invention is to provide a light emitting device with an insulating layer because of the outward appearance of the stair structure of the emitting unit improves the cladding efficiency when the insulating layer being set up the emitting unit and also to avoid the slide and the lose when forming the insulating layer.

One of the objectives of the present invention is to provide a light emitting device with insulating layer wherein the insulating layer and the conducting layer are not flat plane to avoid the bad conducting efficiency.

For the above objectives, the present invention is to provide a light emitting device with an insulating layer which comprises a transparent substrate, a first light emitting unit, a second light emitting unit, an insulating layer and a conducting layer wherein the first and the second light emitting units are set up on the substrate. The second light emitting unit has an outward appearance of a stair structure, the insulating layer are set between the first and the second light emitting units and covers o the top of the outward appearance of a stair structure of the second light emitting unit. The conducting layer is coupled to the first and the second light emitting units therefore the main invention improves the cladding efficiency between the insulating layer and the second light emitting unit due to the outward appearance of a stair structure, and also improves the insulating efficiency for avoiding the leakage. In additional the non-flat plane under the insulating layer can avoid the open loop of conducting layer which causes a poor conduction. The present invention provides a light emitting device with an insulating layer which comprises a sub-mount and a chip set, wherein the chip set comprises a transparent substrate, a first light emitting unit, a second light emitting unit and an insulating layer, plurality conducting elements on the sub-mount. These plurality conducting elements comprises a first connecting terminal and a connecting terminal and the first connecting terminal and the second connecting terminal has a conducting point, the conducting layer is set up on the connecting point, the chip set is set on the sub-mount through rotating by plurality conducting elements. Because of a stair structure of the outward appearance improves the cladding efficiency between the insulating layer and the second light emitting unit in order to avoid the leakage between the first connecting terminal and the second light emitting unit.

DETAILED DESCRIPTION

Figure 1:
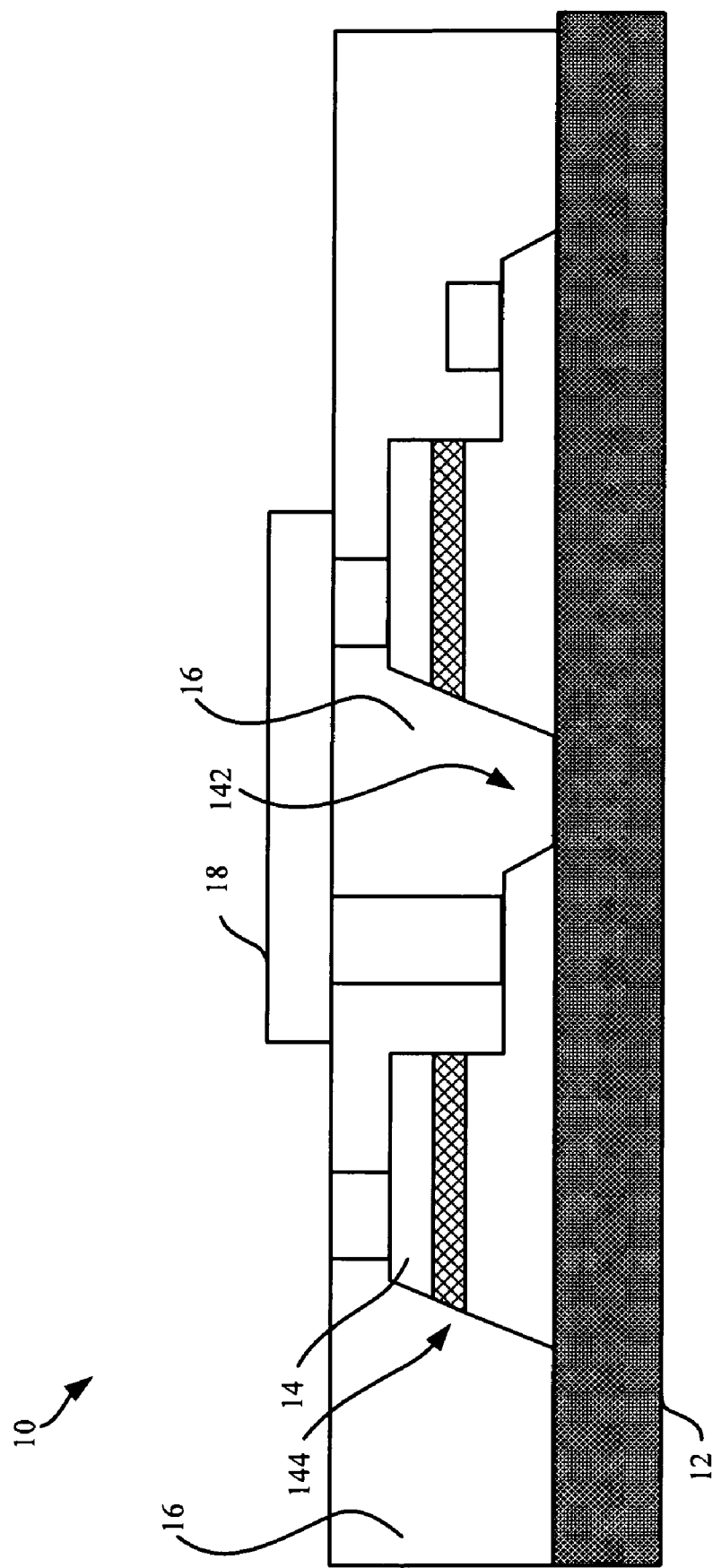
FIG. 1 illustrates a structure diagram of a light emitting device with a insulating layer.
Figure 2:
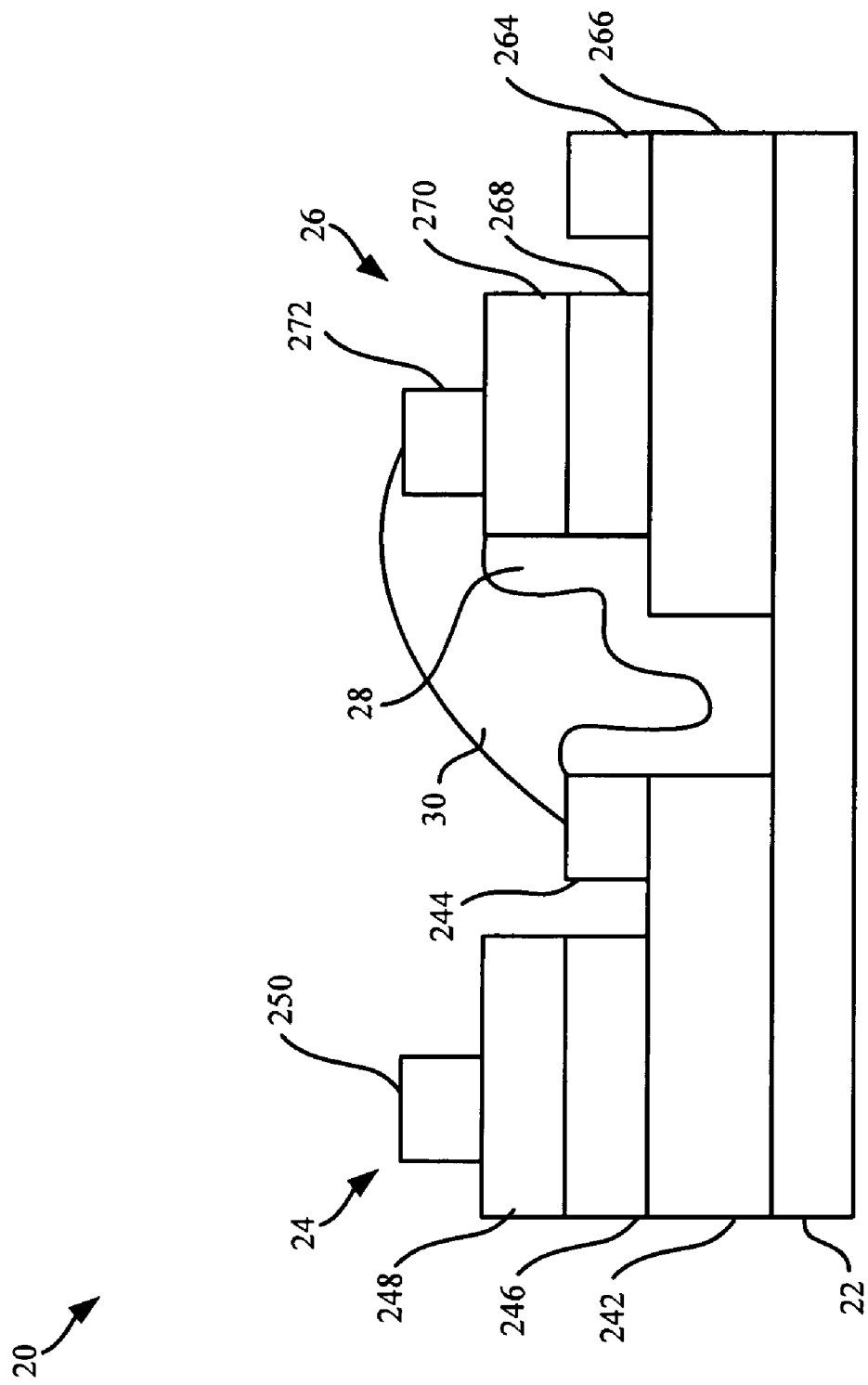
FIG. 2 illustrates a structure diagram of one of the preferable embodiments of the present invention.

FIG. 2 shows a structure of a light emitting device with an insulating layer which is one of the preferable embodiments of the present invention. The figure shows that the present invention has a light emitting device 20 comprises a transparent substrate 22, a first light emitting unit 24, a second light emitting unit 26, a insulating layer 28 and a conducting layer 30, a first light emitting unit 24 and a second light emitting unit 26 set up on the transparent substrate 22, the second light emitting unit 26 has a stair structure appearance, the insulating layer 28 sets between the first light emitting unit 23 and said second light emitting unit 26, conducting layer 30 sets up on the insulating layer 28 and the conducting layer 30 is coupled to the first light emitting unit 24 and second light emitting unit 26. The present invention improves the insulating efficiency of the insulating layer 28 by the appearance of the second light emitting unit 26 having a stair structure, this improves the cladding efficiency the insulating layer 28 and avoiding the leakage between the first light emitting unit 24 and the second light emitting unit 26. The first light emitting unit 24 comprises a first semiconductor layer 242, a first electrode 244, a first light emitting layer 246, a second semiconducting layer 248 and a second electrode 250. The first semiconductor layer 242 sets up on the transparent substrate 22, the first light emitting layer 246 sets up on the first semiconductor layer 242, the second semiconductor layer 248 sets up on the first light emitting layer 246, the first electrode 246 sets up on the first semiconductor layer 242, the second electrode 250 sets up on the second semiconductor layer 248. The second light emitting unit 26 comprises a third electrode 264, a third semiconductor layer 266, a second light emitting layer 268, a fourth semiconductor layer 270 and a fourth electrode 272, The third semiconductor layer 266 sets up on the transparent substrate 22, the second light emitting layer 268 sets up on portion of the third semiconductor layer 266, the fourth semiconductor layer 270 sets up on the second light emitting layer 268, the third electrode 264 sets up on the third semiconductor layer 266, the fourth electrode 272 sets up on portion of the fourth semiconductor layer 270. From bottom to top, the third semiconductor layer 266 to the fourth electrode 272 has an appearance of stair structure, this means the side of the fourth semiconductor layer 270 corresponding to the emitting unit 24 is shorter than the side of the third semiconducting layer 266 corresponding to the emitting unit 24, electrode 272 sets up on the fourth semiconductor layer 270 and are coupled to the conducting layer 30.

In addition, the material of the transparent substrate 22 is a combination of chemical elements of group III-V, semiconductors which are not in crystal form, non-crystallized semiconductors or any combinations of these elements. The switching of the positive and negative waveforms caused by AC current enables the first light emitting unit 24 and second light emitting unit 26 to light. The material of the insulating layer 28 are chosen from any of the materials listed below; silicon dioxide, silicon monoxide, nitride, semiconductors which are not in crystal form, non-crystallized semiconductors. the conducting layer 30 is a transparent conducting layer or a metal conducting layer. The preferable embodiment of the present invention the light emitting device 20, top of the insulating layer 28 is not a horizontal plane, meaning between the insulating layer 28 and the conducting layer 30 is not flat plane in order to avoid open loop.

Furthermore the plurality first light emitting unit 24 and plurality second light emitting unit 26 are connected in parallel, series or in both forming a bridge rectifying circuit, a bridge AC emitting device or a full waveform AC emitting device and being set up on the transparent substrate 22.

Figure 3:
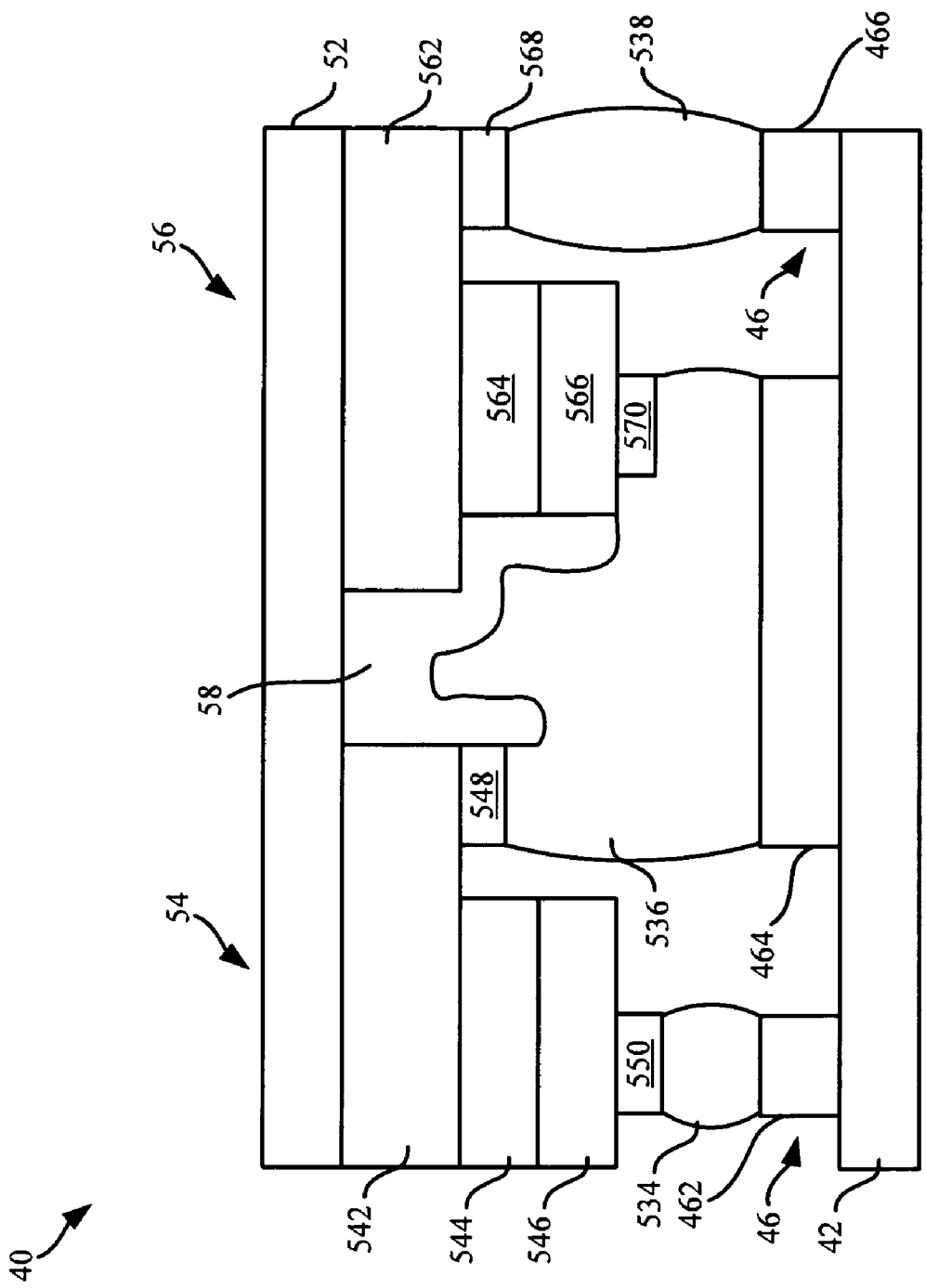
FIG. 3 illustrates a structure diagram of another preferable embodiments of the present invention.

FIG. 3 shows the structure of the light emitting device which is one of the preferable embodiment of the present invention, the light emitting device 40 of the present invention comprises a sub-mount 42 and a chip set 44. The chip set 44 comprises a transparent substrate 52, a first light emitting unit 54, a second light emitting unit 55 and an insulating layer 58. The relationship of the first transparent substrate 52, the first light emitting unit 54, the second unit 56 and the insulating layer 58 are described as above which is the same as the relationship of the transparent substrate 22, the first light emitting unit 24, the second light emitting unit 26 and the insulating layer 28, therefore the detailed description is neglect. After rotating of the chip set 44, the chip set 44 sets up on the sub-mount through a plurality of conducting units 44. The conducting unit 46 of the embodiment comprises a first terminal 462 and a second terminal 466, and a conducting terminal 464 sets up between the first terminal 462 and the second terminal 466, thus the conducting point 464 also sets up on the sub-mount 42. The material of the sub-mount 42 are chosen from chemical elements of group III-V, group II-VI, group IV and group IV-IV, non-crystallized semiconductor, non-crystal form semiconductor and any of the combinations of materials described above. The material of the transparent substrate 52 are chosen from chemical elements of group III-V, semiconductors which are not in crystal form, non-crystallized semiconductors or any combinations of these elements. The material of the insulating layer 58 are chosen from one of the chemical elements listed as following; silicon dioxide, silicon monoxide, silicon tatenitride, nitride, semiconductors which are not in crystal form and non-crystallized semiconductors.

The first light emitting unit 54 from bottom to top comprises a first semiconductor layer 542, a first light emitting layer 544 and a second semiconductor layer 546. Otherwise, the first light emitting unit 54 comprises a first electrode 548 and the second electrode 550. The first electrode 548 sets up on the first semiconductor layer 542, the second electrode 550 sets up on the second semiconductor layer 546. From bottom to top of the second light emitting unit 56 comprises a third semiconductor layer 562, a second light emitting layer 564, a fourth semiconductor layer 566. Otherwise, second light emitting unit 56 comprises a third electrode 568 and a fourth electrode 579, the third electrode 568 sets up on the third semiconductor layer 562, the fourth electrode 570 sets up on the fourth semiconductor layer 566. The second light emitting unit 56 has a appearance of a stair structure form bottom to top, in order to setting up the insulating layer 58 between the first light emitting unit 54 and the second light emitting unit 56. Furthermore a first bump 54 sets between the first the connecting point 462 and the second electrode 550, the conduction point 464 has a conducting layer 536 on it. The first electrode 548 and the fourth electrode 570 connect to the insulating layer 536, and the conducting layer 536 are also connect to the insulating layer 58. A second bump 538 sets between the second connecting point 466 and the third electrode 568.

In order to avoid the leakage between the first light emitting unit 54 and the second light emitting unit 56 as the chip set 44 bonding on the sub-mount 42, the stair structure appearance of the second light emitting unit 56 improves the efficiency of the insulating layer 58 cladding between the first light emitting unit 54 and the second light emitting unit 56. It is to say, the light emitting device 40 of the present invention whose insulating efficiency is improved by the stair structure appearance of the second light emitting unit 56.

In addition, plurality of the first light emitting unit 54 and the second light emitting 56 connect in parallel, series or in both forming a bridge AC circuit, a bridge AC emitting device or a full waveform AC emitting device in order to set up on the transparent substrate 52.

As described above, the present invention is related to a light emitting device with a insulating layer, using the second light emitting unit having an appearance of a stair structure, the insulating layer sets between the first light emitting unit and the second light emitting unit which improves the light emitting device with a insulating layer 40 of the present invention thus the insulating effect of the insulating layer is also improved in order to prevent the leakage. In the end, the top of the insulating layer is not a flat plane, in order to avoid the edge or the vertical side cause switching off when the conducting layer forming on the insulating layer.

What is claimed is:

1. A light emitting device with an insulating layer, comprising:
    a transparent substrate;
    a first light emitting unit setting up on the said transparent substrate and the first light emitting unit comprising:
        a first semiconductor layer setting up on the transparent substrate;
        a first light emitting layer setting up on the first semiconductor layer;
        a second semiconductor layer setting up on the first light emitting layer;
        a first electrode setting up on said first semiconductor layer; and
        a second electrode setting up on said second semiconductor layer;
    a second light emitting unit setting up on the transparent substrate and the second light emitting unit comprising:
        a third semiconductor layer setting up on the transparent substrate;
        a second light emitting layer setting up on the third semiconductor layer;
        a fourth semiconductor layer setting up on the second light emitting layer;
        a third electrode setting up on the third semiconductor layer; and
        a fourth electrode setting up on the fourth semiconductor layer;
    an insulating layer setting between the first light emitting unit and the second light emitting unit and a contact surface between the insulating layer and the second light emitting unit being a stair surface while one side of the third semiconductor layer, the second light emitting layer and the fourth semiconductor layer of the second light emitting unit has an appearance of the stair surface, the insulating layer covered on one side of the first electrode and the first semiconductor layer of the first light emitting unit, and part of top surface of the transparent substrate, and one side with a portion of top surface of the third semiconductor layer, and one side of the second light emitting layer and the fourth semiconductor layer of the second light emitting unit; and
    a conducting layer setting up on said insulating layer, electrically coupling to said first electrode of said first light emitting unit and said fourth electrode of said second light emitting unit.

2. The light emitting device as claimed in claim 1, wherein the top of said insulating layer is not a flat plane.

3. The light emitting device as claimed in claim 1, wherein said plural first emitting units and said plural second light emitting units are connected in series or parallel or connected in both ways forming a bridge rectifying circuit.

4. The light emitting device as claimed in claim 1 wherein said conducting layer is a transparent conducting layer.

5. The light emitting device as claimed in claim 1 wherein said conducting layer is a metal conducting layer.

* * * * *